United States Patent [19]

Cubbison, Jr.

[11] 4,123,722
[45] Oct. 31, 1978

[54] OPERATIONAL AMPLIFIER DECOUPLING CIRCUIT

[75] Inventor: Richard J. Cubbison, Jr., Littleton, Colo.

[73] Assignee: Bell Telephone Laboratories, Incorporated, Murray Hill, N.J.

[21] Appl. No.: 804,877

[22] Filed: Jun. 9, 1977

[51] Int. Cl.$^2$ .............................................. H03F 1/08
[52] U.S. Cl. ..................................... 330/85; 328/151; 330/259; 330/261; 330/296
[58] Field of Search ..................... 330/9, 85, 252, 259, 330/260, 261, 296; 328/151, 162; 307/352, 353

[56] References Cited

U.S. PATENT DOCUMENTS

| | | | |
|---|---|---|---|
| 3,461,396 | 8/1969 | Harris | 330/260 X |
| 3,564,301 | 2/1971 | McGhee et al. | 328/151 X |
| 3,633,004 | 1/1972 | James et al. | 328/151 X |
| 3,775,692 | 11/1973 | Azegami | 328/151 |

OTHER PUBLICATIONS

Delarue et al., "Circuit Presenting a High Input Impedance," IBM *Technical Disclosure Bulletin*, v. 19, No. 11, Apr. 1977, pp. 4221–4222.
Choice, "Series–Connected Op Amps Null Offset Voltage," *Electronics*, Mar. 27, 1972, p. 92.
Maillet, "Sample and Hold Circuit," IBM *Technical Disclosure Bulletin*, vol. 19, No. 2, Jul. 1976, pp. 536–537.
Naylor, "Digital and Analog Signal Applications of Operational Amplifiers," *IEEE Spectrum*, May 1971, pp. 79–87.

*Primary Examiner*—James B. Mullins
*Attorney, Agent, or Firm*—James M. Graziano

[57] ABSTRACT

A sample and hold circuit is disclosed which employs a matched pair of operational amplifiers as a decoupling circuit to isolate the output of the sample and hold circuit from the sampling capacitor. Prior art decoupling circuits employ a simple isolation amplifier which has a tendency to charge the sampling capacitor with the isolation amplifier input bias and leakage currents. The disclosed decoupling circuit employs one of a pair of matched operational amplifiers as a compensation circuit to dynamically generate the bias and leakage currents found at the input of the other operational amplifier, which is employed as the sample and hold isolation amplifier. Thus, the net quiescent current into the input of the decoupling circuit is zero, thereby eliminating the capacitor charging problem of prior art isolation amplifiers.

8 Claims, 4 Drawing Figures

OPERATIONAL AMPLIFIER DECOUPLING CIRCUIT

FIELD OF THE INVENTION

The disclosed invention relates to sample and hold circuits and in particular to a decoupling circuit employing a matched pair of operational amplifiers which decoupling circuit has a net quiescent current of zero.

DESCRIPTION OF PRIOR ART

A sample and hold module is a device that tracks an input signal and then holds the instantaneous input value upon command by a logic control circuit. The simplest sample and hold configuration is a switch and sampling capacitor combination. The switch is connected in series between the input and output terminals of the sample and hold module while the sampling capacitor is connected across the output terminals. While the switch is closed, the output voltage will be identical to the input voltage. Once the switch is opened, the sampling capacitor provides the memory, holding the output voltage at the value last monitored at the module input terminals.

The difficulty with this configuration is that any load connected to the sample and hold output terminals will quickly discharge the sampling capacitor thereby destroying the information content of the sampling capacitor. To alleviate this problem, prior art sample and hold circuits employ a unity gain isolation amplifier connected between the sampling capacitor and the module output terminals.

However, sample and hold circuit isolation amplifiers have variable input bias and leakage currents which charge the sampling capacitor, thus introducing a non-linear random error component into the resultant signal. Prior art solutions to this sampling capacitor charging problem employ field effect transistor (FET) operational amplifiers to reduce the leakage currents and, thus, proportionately reduce this error component. However, high quality FET operational amplifiers are expensive and an inexpensive resolution to the sampling capacitor charging problem was sought. Therefore, it is desirable in sample and hold circuits to utilize decoupling circuitry that provides both low leakage and bias currents and a high input impedance in order that the decoupling circuitry will not modify the data stored in the sampling capacitor.

In view of the foregoing, it is an object of this invention to provide a decoupling circuit that does not affect the data stored in the sampling capacitor.

It is a further object of this invention to provide a decoupling circuit that presents a high input impedance to the sampling capacitor.

It is another object of this invention to provide a decoupling circuit that provides a high degree of isolation between input and output terminals.

SUMMARY OF THE INVENTION

In accordance with my invention, I provide an operational amplifier decoupling circuit that does not affect the information content of the sampling capacitor. This is accomplished by employing a matched pair of operational amplifiers to reduce the tendency of sample and hold circuits to charge the sampling capacitor with the isolation amplifier input bias and leakage currents. One of the matched pair of operational amplifiers is employed as an externally located compensation circuit. The compensation circuit operational amplifier monitors its own input bias and leakage currents to dynamically generate and supply the exact input bias and leakage currents required by the other matched operational amplifier which, in turn, is employed in the standard fashion as the sample and hold isolation amplifier. The input bias and the leakage current characteristics of the two operational amplifiers are closely matched, thus minimizing the difference between the bias and leakage currents monitored and generated by the compensation circuit and those required by the isolation amplifier. This matching of the two amplifiers also assures excellent tracking and stability characteristics.

Accordingly, it is a feature of this invention to provide compensation circuit facilities that dynamically generate and supply the exact input bias and leakage currents required by the basic sample and hold isolation amplifier.

It is a further feature of this invention to provide compensation circuit facilities that employ active circuitry.

It is a further feature of this invention to provide decoupling circuit facilities that reduce the net quiescent current into the sampling capacitor to zero.

BRIEF DESCRIPTION OF THE DRAWING

The operation and utilization of the present invention will be more fully apparent from the following description of the drawing in which.

GENERAL DESCRIPTION — FIGS. 1 AND 2

Figure 1:
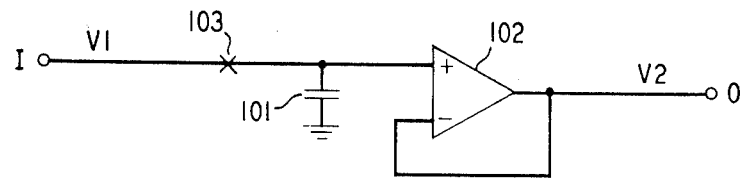
FIG. 1 illustrates a basic prior art sample and hold circuit.

FIG. 1 shows a basic prior art sample and hold circuit consisting of a sampling switch make contact 103, sampling capacitor 101 and operational amplifier 102. The operational amplifiers used in sample and hold circuits are well known in the art and are described in the book "Operational Amplifiers — Design and Applications" by Burr-Brown Research Corporation Engineering Staff, published by McGraw-Hill Company, 1971. Accordingly, the details of operational amplifier operation will not be discussed herein.

Input signal voltage V1 appearing at input terminal I of the sample and hold circuit is connected through a closed make contact 103 of the sampling switch to sampling capacitor 101. Input signal voltages V1 charges capacitor 101 to voltage level V1 while switch 103 is closed. Operational amplifier 102 is connected in a unity gain configuration between sampling capacitor 101 and output terminal 0 of the sample and hold circuit. Operational amplifier 102 functions as a unity gain isolation amplifier, thereby providing voltage V1, as it appears on sampling capacitor 101, at sample and hold circuit output terminal 0 while isolating sampling capacitor 101 from any load applied to sample and hold circuit output terminal 0. Therefore, while switch 103 is closed, output voltage V2 equals input voltage V1. Once switch 103 is opened, capacitor 101 provides the memory, maintaining voltage level V1 at the input of isolation amplifier 102, subject, however, to being discharged by the bias and leakage currents appearing at the input of isolation amplifier 102. Thus, the bias and leakage currents of isolation amplifier 102 modify the information content of capacitor 101 by changing the voltage level stored thereon from V1 to some other value, determined by the leakage and bias currents of isolation amplifier 102. Output voltage V2 tracks the voltage level appearing on sampling capacitor 101 and therefore, output signal V2 contains an error component determined by the random value of the input bias and leakage currents of unity gain isolation amplifier 102.

Figure 2:
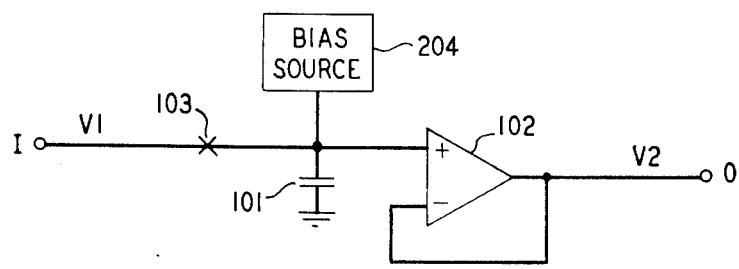
FIG. 2 illustrates one embodiment of my invention in block diagram form.

FIG. 2 illustrates one embodiment of my invention in block diagram form, wherein a source of bias current 204 has been added to the basic sample and hold circuit of FIG. 1. Due to the random nature of the input bias and leakage currents of unity gain isolation amplifier 102, bias source 204 must be a nonlinear current generator to be capable of tracking the needs of unity gain isolation amplifier 102. To be effective, the response time of bias source 204 must be short so that the bias current generated therein dynamically satisfies the requirements of isolation amplifier 102.

DETAILED DESCRIPTION — FIGS. 3 AND 4

Figure 3:
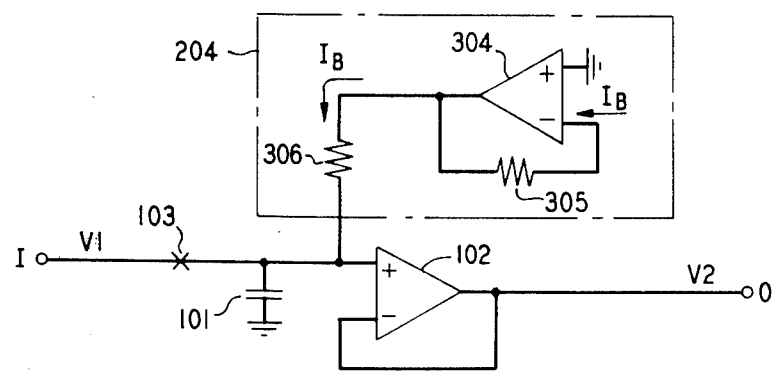
FIG. 3 shows one embodiment of my invention.

FIG. 3 discloses one embodiment of my invention wherein bias source 204 of FIG. 2 is implemented by resistors 305 and 306 and operational amplifier 304. Resistors 305 and 306 are selected to be equal in value and the positive input terminal of operational amplifier 304 is connected to circuit ground. Therefore, operational amplifier 304 is connected in the unity gain configuration and functions to sense its own leakage and bias currents which appear at its negative input terminal. Thus, operational amplifier 304 generates an output signal consisting of its own leakage and bias currents and applies this signal, $I_B$, through resistor 306 to sample and hold circuit sampling capacitor 101.

Operational amplifiers 102 and 304 are selected to be a matched pair of operational amplifiers and, therefore, their characteristics are closely matched, including the input bias and leakage current characteristics. Thus, bias current $I_B$, generated by operational amplifier 304, supplies the needs of unity gain isolation amplifier 102 thereby eliminating the charging of the sampling capacitor by the sample and hold circuit isolation amplifier input bias and leakage currents.

However, the AC output voltage of operational amplifier 304 is equal to the voltage appearing at its positive input terminal, which is circuit ground. Therefore, sampling capacitor 101 will be discharged by resistor 306 which is connected to the output of operational amplifier 304 or circuit ground. Thus, the signal V1 on sampling capacitor 101 sees an impedance consisting of resistor 306 to ground and sampling capacitor 101 will discharge with a time constant determined by the values of resistor 306 and sampling capacitor 101. The values of resistor 306 and sampling capacitor 101 can be selected to make the time constant long in relation to the sampling rate, but this still adds an error component to the output signal while also placing additional constraints on the design of the sample and hold circuit.

Figure 4:
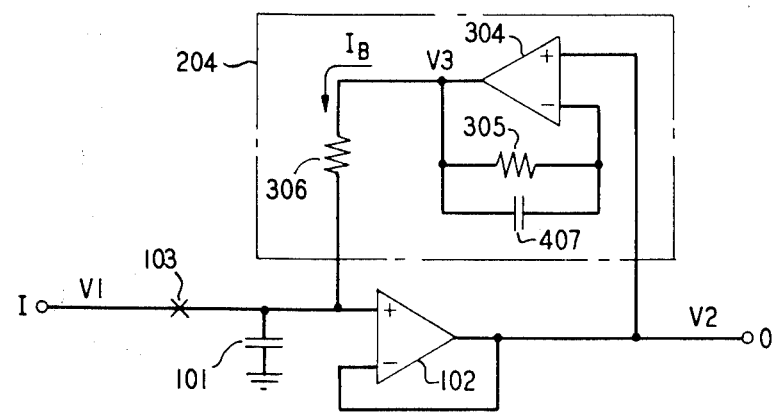
FIG. 4 shows a preferred embodiment of my invention.

The sample and hold circuit of FIG. 4 illustrates the preferred embodiment of my invention, wherein bias source circuit 204 of FIG. 3 has been modified by removing the connection between the positive input terminal of operational amplifier 304 and ground, and connecting the operational amplifier positive input terminal instead to output terminal 0 of the sample and hold circuit. Therefore, operational amplifier 304 generates an output signal consisting of two components, the first being the voltage signal V2 appearing at its positive input terminal which, as discussed above, is equal to V1. The second signal component generated by operational amplifier 304 is a function of the aforementioned leakage and bias currents $I_B$. Therefore, the output of operational amplifier 304 is equal to voltage V2 plus bias current $I_B$ times resistor 306. The bias current $I_B$ is applied, as mentioned above, through resistor 306 to sampling capacitor 101. Input signal voltage V1 sees a high impedance because the other side of resistor 306 is connected to the output of operational amplifier 304 which is held at a voltage level of V2, which equals V1. Therefore, assuming ideal operational amplifiers, the effective impedance of bias source 204 is infinite and sampling capacitor 101 does not discharge through resistor 306. Capacitor 407 is provided between the output and negative input terminals of operational amplifier 304 to speed up the response time of operational amplifier 304 thus keeping the effective resistance of 306 high even for rapid variations in V1.

Thus, the disclosed bias source 204 comprised of resistors 305 and 306, capacitor 407, and operational amplifier 304 generates the exact bias and leakage currents $I_B$ required by unity gain isolation amplifier 102 while presenting a high impedance to signals appearing on sampling capacitor 101. The disclosed bias source circuit 204 monitors and generates the required bias and leakage currents $I_B$ external to the sample and hold circuit and supplies these required currents to unity gain isolation amplifier 102 without altering the information content of sampling capacitor 101. Thus, the net quiescent current into sampling capacitor 101 is equal to zero and input signal voltage V1 is maintained in the sample and hold circuit memory, thereby causing the sample and hold circuit to maintain a constant output voltage of V1.

While a specific embodiment of the invention has been disclosed, variations in procedural and structural detail, within the scope of the appended claims, are possible and are contemplated. There is no intention of limitation to what is contained in the abstract or the exact disclosure as herein presented. The above-described arrangements are only illustrative of the application of the principles of my invention. Normally, other arrangements may be devised by those skilled in the art without departing from the spirit and the scope of my invention.

What is claimed is:
1. A decoupling circuit comprising:
an input terminal;
an output terminal;
isolation amplifier means for isolating said decoupling circuit output terminal from said decoupling circuit input terminal, said isolation amplifier means having an input terminal connected to said decoupling circuit input terminal, an output terminal connected to said decoupling circuit output terminal;
active circuit bias current generating means connected to said input of said isolation amplifier means for dynamically generating and supplying said isolation amplifier means with dc input bias current;
wherein said bias current generating means comprises a first operational amplifier of a matched pair of operational amplifiers, and said isolation amplifier means comprises a second operational amplifier of said matched pair of operational amplifiers; and wherein said active circuit bias current generating means senses its own dc input bias current to generate said isolation amplifier means dc input bias current.

2. The invention of claim 1 wherein each said operational amplifier of said matched pair of operational amplifiers has an output terminal, a positive input terminal, and a negative input terminal;

wherein said output terminal of said second operational amplifier is connected via a feedback path to said negative input terminal of said second operational amplifier, said positive input terminal of said second operational amplifier is connected to said decoupling circuit input terminal wherein said current generating means additionally comprises:

a feedback impedance connected between said first operational amplifier output terminal and said first operational amplifier negative input terminal;

an output impedance connected between said first operational amplifier output terminal and said isolation amplifier input terminal; and wherein said first operational amplifier positive input terminal is connected to a reference voltage for sensing the required said dc input bias current.

3. The invention of claim 2 wherein said reference voltage is said isolation amplifier output terminal.

4. The invention of claim 3 wherein said feedback impedance comprises a parallel combination of a resistor and capacitor; and said output impedance comprises a resistor.

5. A decoupling circuit comprising:
an input terminal;
an output terminal;
a first operational amplifier for isolating said decoupling circuit output terminal from said decoupling circuit input terminal, said first operational amplifier having a positive input terminal connected to said decoupling circuit input terminal, an output terminal connected to said decoupling circuit output terminal, a negative input terminal connected to said decoupling circuit output terminal;

a second operational amplifier for generating the input dc bias current required by said first operational amplifier positive input terminal, wherein said second operational amplifier comprises a negative input terminal, a positive input terminal, an output terminal;

a feedback impedance connected between said second operational amplifier output terminal and said second operational amplifier negative input terminal for establishing the gain of said second operational amplifier;

an output impedance connected between said second operational amplifier output terminal and said first operational amplifier positive input terminal; and wherein said second operational amplifier positive input terminal is connected to a source of voltage for sensing the required said dc input bias current.

6. The invention of claim 5 wherein said first operational amplifier and said second operational amplifier comprise a matched pair of operational amplifiers.

7. The invention of claim 5 wherein said second operational amplifier positive input terminal is connected to a source of voltage comprising said first operational amplifier output terminal.

8. The invention of claim 5 wherein said feedback impedance comprises a parallel combination of a resistor and capacitor, and said output impedance comprises a resistor.

* * * * *